April 30, 1968 B. D. PERRY 3,381,246
DISTRIBUTED TRANSDUCER ULTRASONIC
DELAY LINE AND COUPLING APPARATUS
Filed Oct. 8, 1964
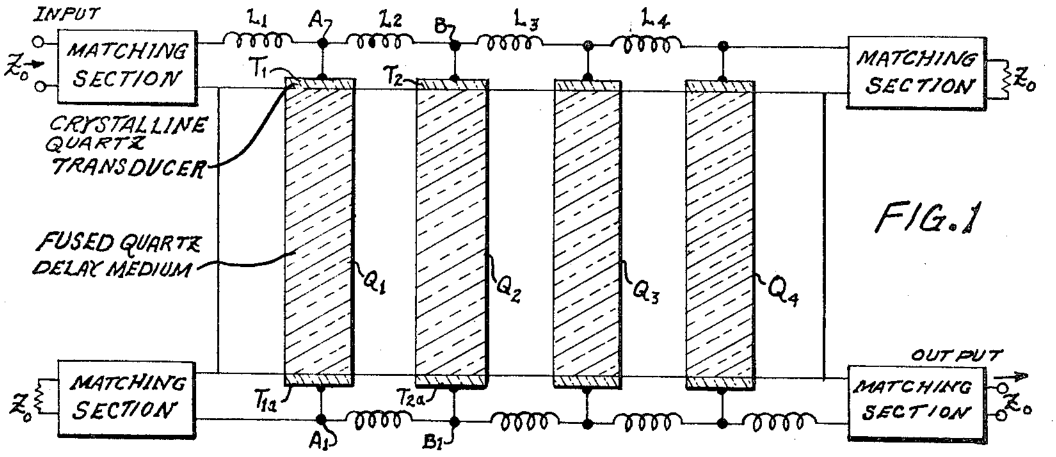
FIG. 1
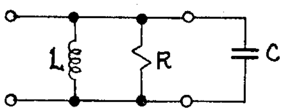
FIG. 2-A
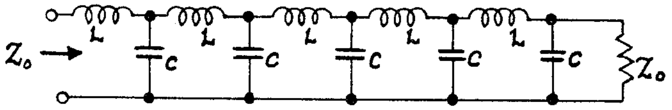
FIG. 2-B
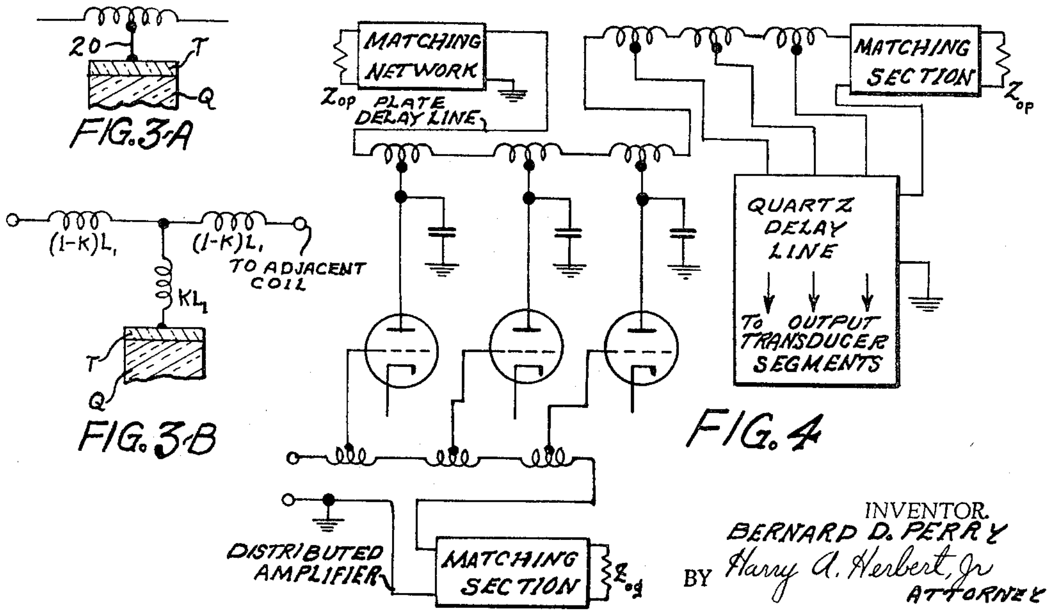
FIG. 3-A, FIG. 3-B, FIG. 4
INVENTOR.
BERNARD D. PERRY
BY Harry A. Herbert, Jr
ATTORNEY
Herbert E. Farmer
AGENT United States Patent Office 3,381,246
Patented Apr. 30, 1968

3,381,246
DISTRIBUTED TRANSDUCER ULTRASONIC DELAY LINE AND COUPLING APPARATUS

Bernard D. Perry, Stoneham, Mass., assignor to the United States of America as represented by the Secretary of the Air Force Filed Oct. 8, 1964, Ser. No. 402,666
1 Claim. (Cl. 333—30)

ABSTRACT OF THE DISCLOSURE

A distributed ultrasonic transducer delay network responsive to wideband input signals, including an input and an output lumped-parameter electrical delay line, quartz ultrasonic time delays and a network interconnecting the delay lines and the input and output delay lines. The network includes a corresponding plurality of pairs of input and output transducers as shunt elements of both delay lines.

This invention relates to wave transmission and, more particularly, to delay lines and apparatus coupling into and out of delay lines of the electro-acoustic solid delay line type used in wideband, relatively short time delay applications.

Ultrasonic delay lines comprising piezoelectric crystal quartz attached to a multiple-reflection fused silica line have numerous applications in radar data processing systems, in digital computer systems, and in recirculating delay and frequency-shift systems. However, a disadvantage hindering greater use of prior art ultrasonic delay lines in devices requiring large delay-bandwidth product is their large insertion loss (voltage ratio). Whenever a wideband delay channel is required, because of the large insertion loss of the delay line, the dynamic range of the entire equipment is adversely affected. This loss, for instance, is the most important contributor to the noise figure of delay and frequency-shift systems.

This large insertion loss is partly due to the conversion loss of the transducers and partly due to ultrasonic beam spreading and adsorption within the fused silica delay medium. In relatively short delay lines (less than 500 $\mu$sec.) the bulk of the loss is in the transducers. The conversion loss of transducers can be reduced by increasing the transducer area or by using material of high electromechanical coupling co-efficient. However, either technique results in high transducer capacity, and thus for a given bandwidth, the voltage gain (inverse of loss) is unchanged; namely, the "gain-bandwidth product" of the delay line is not improved. To drive the larger capacity over a given bandwidth means larger outputs from the line driving amplifier. To do this and still minimize the level of distortion in the line driver often requires very complex and extensive circuitry. For example, even use of high-powered, air-cooled transmitting type tubes in the line driver and special low noise figure front ends on the post-delay amplifier only partly reduces the insertion loss.

Accordingly, a principal object of this invention is to provide a solid ultrasonic delay line and coupling apparatus having a very high gain-bandwidth product.

Another object of this invention is to provide an ultrasonic delay line and coupling apparatus which permits the efficient use of a distributed amplifier as a line driver.

Still another object of this invention is to provide an ultrasonic solid delay line and coupling apparatus which significantly reduces the noise figure in delay and frequency shift recirculators.

A further object of this invention is to provide an ultrasonic solid delay line and coupling apparatus which enables construction of a "stagger-tuning," more uniform, wideband delay line.

A still further object of this invention is to provide an ultrasonic solid delay line and coupling apparatus which minimizes the effects of lead inductance at very high frequencies.

To accomplish the foregoing, and additional objects, the instant invention comprehends the adaptation of electromagnetic lumped-parameter delay lines and distributed amplifier coupling techniques (such as those described in Chapter 10 of "Pulse and Digital Circuits," by Jacob Millman et al., McGraw-Hill Book Co., Inc. (1946)) to the delay line transducer problem. Briefly, instead of one large transducer, several small transducers are used, and the capacity of each becomes the shunt element in a multisection lumped-parameter delay line. Thus, the characteristic impedance of the lumped-parameter line replaces the large single transducer capacity as the input and output impedance of the device.

The invention will be best understood by reference to the following detailed description, taken in connection with the appended drawings in which:

FIG. 1 is a schematic representation of a 4-path distributed transducer ultrasonic delay line;

FIGS. 2*a* and 2*b* illustrate the electrical equivalent at the input end of a single transducer and 5-transducer network;

FIGS. 3*a* and 3*b* illustrate an embodiment and its electrical equivalent utilizing center-tap solenoids; and FIG. 4 illustrates use of the distributed transducer in combination with a distributed amplifier.

Now referring to FIG. 1, shown is a 4-path distributed transducer delay with four pairs of input and output transducers in a straight-through path arrangement, with all paths, $Q_1$, $Q_2$, $Q_3$ and $Q_4$ in a single piece of fused quartz. The resistive terminating impedance, $Z_0$, of each of the two lumped-constant lines replaces the transducer's capacity as the input and output impedance of the device. Four routes from input to output are available to the signal. Because all circuits are non-dispersive and all lumped-line sections have the same time delay, whichever route the signal takes, the four signals arrive at the output at the same time. That is to say, the time it takes for one signal to go from the input through $L_1$ to dividing point A through $T_1$, $Q_1$ and $T_{1a}$ to point $A_1$ to output is exactly the same time as the time it takes for the other portion of the signal to go from the input through $L_1$, past first dividing point A, through $L_2$ to second dividing point B and on to $T_2$, $Q_2$ and $T_{2a}$, point B, to $B_1$ and to the output, etc.

The 4-section distributed transducer line of FIG. 1, 20 microseconds long, has shown an improvement of 10 db in gain-bandwith of the delay line and associated circuitry over conventional coupling methods at a center frequency of 44 mc. and bandwidth of 16 mc.

If, as shown in FIG. 1, the acoustic paths are all in a single piece of fused quartz, the segments $T_{1a}$, $T_2$; $T_{1a}$, $T_{2a}$ and $Q_1$, $Q_2$, etc. must be sufficiently far apart to keep crosstalk to an acceptable level. For very short delay lines, say 50 $\mu$sec. or less, there is no crosstalk problem because the beams from the input transducers will be confined in searchlight fashion when they reach their output transducers, $T_{1a}$, $T_{2a}$, etc. For example, in a 20 $\mu$sec. delay line of FIG. 1, with the transducers spaced by a distance equal to their length, crosstalk levels are more than 45 db down. In longer lines it is necessary to use separate pieces of quartz to avoid the crosstalk problem.

It should not be inferred that it is mandatory to use the matching sections shown in FIG. 1. The purpose of the matching section is to absorb reflections of the signal caused by imperfections of the electrical delay line.

For a proper consideration of the design factors for FIG. 1, it will be profitable to consider FIGS. 2*a* and 2*b* which illustrate the improvement in performance at the input end of a delay line having a multi-transducer design. In FIGS. 2*a* and 2*b*, the two networks are designed so that the time delay error is preserved over approximately the same bandwidth. Namely, to insure constant time delay within the lumped-element line over the bandwidth of the ultrasonic line, it is necessary to design the lumped-element line to a relatively high cutoff frequency. In single transducer network, FIG. 2*a*, C is the single transducer capacity, L, inductance, is chosen to resonate at the center frequency of the delay line, and R (resistance), is chosen to meet the required bandwidth. Thus, for single transducer having capacity $C=100$ pf., $f_0=40$ mc., and 3 db $BW=30$ mc., then it can be shown that $L=.16$ $\mu$h, $R\pm52$ ohms, group delay, $T_g=52.5$ ns. at $f_0$, and $T_g=\frac{1}{2}$ this at 3 db points.

Where $f_0$=the center frequency
pf=picofarads
mc.=megacycles
db=decibels
BW=bandwidth
$T_q$=group delay
ns.=nanoseconds
$Z_0$=characteristic impedance of the transmission lines.

In contrast, the improvement that can be expected using the five transducer design of FIG. 2*b*, neglecting matching sections, where each of the transducers has a capacity of 20 pf., then it can be shown that $L\pm0.5$ $\mu$h, $T_g=17$ ns., and $Z_0=158$ ohms. Thus, the preceding improvement in load impedance is 158/52 at 40 mc. and 3 db better at the 3 db points of the single transducer design. A still further improvement can be obtained by reducing the cutoff frequency, $f_c$, of the lumped-element line.

At the output end of the delay line the improvement which can be expected has somewhat different significance. Consider the transducer and associated network as a current generator and associated internal impedance. With the single transducer method, the output voltage varies with frequency according to the internal impedance. However, with the multi-transducer design, a constant output voltage is produced which is a larger voltage than in the single transducer case. (This analysis neglects the mechanical resonance effect of the transducer, which alters the value of current, making it somewhat frequency dependent.)

The problem of trimming each channel's delay to an exact amount can be solved as follows: (1) Delay lines can be ground to 50 millionths of an inch, which is within a degree of phase shift at the highest frequencies used; and (2) with less precise grinding and in order to allow for inhomogenieties in the quartz, electrical adjustment can be made by trimming the values in the lumped-element lines so that the total delay (lumped-element plus ultrasonic) is constant.

The variation illustrated in FIGS. 3*a* and 3*b* has particular utility for wideband signals having a top frequency greater than in 50 mc. At these high frequencies the effects of the lead inductance of the wire to the transducer can be considerable. By connecting the transducers to the center-tap of a center-tap solenoid, FIG. 3*a*, the mutual inductance between the two halves of the solenoids can be adjusted to compensate for the lead wire inductance at high frequency.

FIG. 4*b* is the equivalent circuit of a mutually-coupled coil. The lead inductance of wire 20 to transducer T can be easily compensated for by reducing the term $KL_1$. In a similar manner, the inductance of the leads between the filter sections can be absorbed into the $(1-K)L_1$ terms.

FIG. 4 illustrates the compatibility of the instant distributed transducer technique with a distributed amplifier. Since the output network of the distributed amplifier is also a lumped-constant delay line, it can be readily joined to the distributed transducer's input lumped-constant line. The two lines are in fact, one, with the first sections shunted by tube plus trimmer capacities and the last sections by transducer capacities. With the arrangement of FIG. 4, better results are obtained by using a fairly large number of small tubes operating at low power supply voltage than with single or push-pull pairs of large tubes using high-voltage supplies. For example, it has been found that a 14-tube distributed amplifier stage using No. 7788 miniature pentodes outperforms the two 4 x 250 type air-cooled tubes it takes to get two volts RMS at an acceptable distortion level, across the delay line's input transducer, in a device having a 30 mc. bandwidth.

To extend the instant distributed transducer technique to long ultrasonic delay lines, certain compromises are necessary. By a "long" line is meant one in which the output transducer is in the far-field of the effective input transducer (viz, well beyond $2a^2/\tau$ where $a$ is the effective aperture and $\tau$ is the acoustic wave length). In the far-field, the beams from the individual elements of the distributed input transducer have merged and, ideally, a "sin x over x" interference pattern results. If the output transducer is not distributed but rather is a single transducer large enough to intercept almost all the energy in the main beam, the far-field effect is overcome at the expense of the reduced performance of the single transducer and its coupling net versus the distributed output circuitry.

Since the input is still distributed there is a tilting of the acoustic beam away from a line normal to the input facet. This is similar to the tilting of the RF beam in a phased array antenna. The tilt angle will, however, be independent of frequency since, to a good approximation, the lumped line coupling network and acoustic medium are non-dispersive. Furthermore, the tilt angle is quite small (a typical value is about $3\times10^{-3}$ radians) since it is equal to the ratio of the acoustic propagation velocity in quartz to the velocity with which electric energy propagates down the lumped-parameter delay line. If this resulting small displacement of the beam at the output transducer cannot be tolerated, grinding the input facet at a compensating angle completely overcomes the difficulty.

Also, the transfer function of the lumped line from its input to the transducers is not the same as from the input to its output. Since no compensating output lumped-constant line is present, a U-shaped frequency response results. This is compensated for elsewhere in the delay channel, for example, by detuning one of the amplifiers.

The specific design features of the above-described embodiments are intended to be illustrative only since these parameters may be changed as required without departing from the scope of the invention. For example, by arranging elements properly (closer transducer spacing, smaller apertures, longer delay lengths) one comes up with the sonic equivalent of a phased array.

Another degree of freedom is afforded to the delay line designer by the multiple transducer technique. By cutting the various transducers so as to resonate at different frequencies, an effect analogous to stagger-tuning can be achieved and more uniform wideband delay lines can be built.

I claim:

1. A distributed ultrasonic transducer delay network responsive to wideband input signals comprising: an input and an output lumped-parameter electrical delay line including, a pair of matching sections connected at the electrical ends of said input delay line, and a pair of matching sections connected at the electrical ends of said output delay line; ultrasonic delaying means; and an associated network interconnecting said delaying means with said input and output lumped-parameter lines comprising, a plurality of pairs of input and output transducers as the shunt elements of said input and output electrical delay lines.

References Cited

UNITED STATES PATENTS

| | | | |
|---|---|---|---|
| 2,806,155 | 9/1957 | Rotkin | 333—30 |
| 2,815,490 | 12/1957 | De Faymoreau | 333—30 |
| 2,921,134 | 1/1960 | Greenspan | 333—30 |
| 3,012,203 | 12/1961 | Tien | 330—5 |
| 3,310,761 | 3/1967 | Brauer | 333—30 |
| 3,321,738 | 5/1967 | Trott | 333—30 |

ELI LIEBERMAN, *Primary Examiner.*

C. B. BARAFF, *Assistant Examiner.*